US008782110B2

(12) United States Patent
Christoph (10) Patent No.: US 8,782,110 B2
(45) Date of Patent: Jul. 15, 2014

(54) SIGNAL PROCESSING SYSTEM EMPLOYING TIME AND FREQUENCY DOMAIN PARTITIONING

(75) Inventor: Markus Christoph, Straubing (DE)

(73) Assignees: Harman International Industries, Incorporated, Stamford, CT (US); Harman Becker Automotive Systems GmbH, Stamford, CT (US)

( * ) Notice: Subject to any disclaimer, the term of this patent is extended or adjusted under 35 U.S.C. 154(b) by 1469 days.

(21) Appl. No.: 11/775,690

(22) Filed: Jul. 10, 2007

(65) Prior Publication Data

US 2008/0126461 A1    May 29, 2008

(30) Foreign Application Priority Data

Jul. 10, 2006   (EP) .................................. 06014253
Jun. 13, 2007   (EP) .................................. 07011621

(51) Int. Cl.
*G06F 17/10*    (2006.01)
*G06F 17/15*    (2006.01)

(52) U.S. Cl.
USPC ............ 708/315; 708/319; 708/321; 708/421

(58) Field of Classification Search
CPC ......................... H03H 17/0213; G06F 17/156
USPC .................. 708/315, 321, 420, 421
See application file for complete search history.

(56) References Cited

U.S. PATENT DOCUMENTS 4,992,967 A * 2/1991 Auvray ......................... 708/321
5,502,747 A * 3/1996 McGrath ...................... 375/350
5,809,069 A * 9/1998 Polley et al. ................. 375/222
5,999,574 A    12/1999 Sun et al.
7,502,816 B2 * 3/2009 Kumamoto et al. .......... 708/405
2006/0098809 A1    5/2006 Nongpiur et al.

FOREIGN PATENT DOCUMENTS

| EP | 0 531 242 A1 | 3/1993 |
| WO | WO 00/39926 | 7/2000 |
| WO | WO 01/18960 A1 | 3/2001 |
| WO | WO 01/73947 A1 | 10/2001 |
| WO | WO 01/86808 A1 | 11/2001 |

OTHER PUBLICATIONS

European Search Report for EP 06014253, dated Jan. 31, 2007.
Canadian Intellectual Property Office, Examination Report of Canadian Patent Application No. 2593183, Feb. 5, 2014, WIPO, 2 pages.

* cited by examiner

*Primary Examiner* — Chuong D Ngo
(74) *Attorney, Agent, or Firm* — Alleman Hall McCoy Russell & Tuttle LLP (57) ABSTRACT

The present invention relates to a method for processing a digital input signal by a Finite Impulse Response, FIR, filtering means, comprising partitioning the digital input signal at least partly in the time domain to obtain at least two partitions of the digital input signal; partitioning the FIR filtering means in the time domain to obtain at least two partitions of the FIR filtering means; Fourier transforming each of the at least two partitions of the digital input signal to obtain Fourier transformed signal partitions; Fourier transforming each of the at least two partitions of the FIR filtering means to obtain Fourier transformed filter partitions; performing a convolution of the Fourier transformed signal partitions and the corresponding Fourier transformed filter partitions to obtain spectral partitions; combining the spectral partitions to obtain a total spectrum; and inverse Fourier transforming the total spectrum to obtain a digital output signal.

34 Claims, 7 Drawing Sheets

SIGNAL PROCESSING SYSTEM EMPLOYING TIME AND FREQUENCY DOMAIN PARTITIONING

BACKGROUND OF THE INVENTION

Priority Claim

This application claims the benefit of priority from EP 06014253, filed Jul. 10, 2006, and to EP 07011621, filed Jun. 13, 2007, both of which are incorporated herein by reference.

TECHNICAL FIELD

The present disclosure relates to a signal processing system and, more particularly, to a signal processing system that employs time and frequency domain partitioning.

RELATED ART

Signal processing systems are used in a wide range of applications. One set of applications includes speech signal processing/recognition, where the signal processing system may be used to enhance the intelligibility of the speech signals. Another such application is the enhancement of the quality of signals transmitted and/or received in a communication system. Wired and/or wireless communication between two parties may be carried out where one or both of the parties are present in a noisy background environment. One example of such a communication environment is a hands-free voice communication and/or command system in a vehicle. Signal processing in such communication systems may be used to reduce background noise and to enhance the intelligibility of the speech signals.

Other problems also exist in such communication environments. For example, the signals of one party may be emitted by a loudspeaker in the receiving party's environment. These omissions may be picked up by the microphone used by the remote party. If picked-up by the microphone, transmissions from the remote party may include unpleasant echoes that may affect the quality and intelligibility of the voice conversation. In certain circumstances, acoustic feedback may lead to a complete breakdown of communication.

To overcome such echo/feedback problems, the communication system may include a signal processing system that is configured as an echo canceller. In an echo canceller, a replica of the acoustic feedback response may be synthesized and a compensation signal may be obtained from the received signal at the loudspeaker. This compensation signal may be subtracted from the signal of the microphone to generate the signal that is transmitted from the remote party.

Communication systems, speech processing/recognition systems, and other systems may also use one or more equalization filters to enhance the quality of the subject speech signal as well as the transmitted and/or received signals. The equalization filters operate on the acoustic signals by boosting or attenuating the signals over a pre-determined frequency range. The equalization filter may include one or more shelving filters for selectively boosting/attenuating either the low or high frequency range. The equalization filter may also include one or more peaking filters for boosting/attenuating signals with the center frequency, bandwidth in-band and out-of-band gains being separately adjustable. Still further, the equalization filter may be in the form of a parametric equalizer that combines one or more shelving filters and peaking filters.

The filters used in such signal processing systems may include digital filters that are implemented in hardware and/or software. Digital filters may include Finite Impulse Response (FIR) filters and Infinite Impulse Response (IIR) filters. Each of these digital filter types has advantages and disadvantages that make them suitable for specific applications. FIR filters are very stable but may require the use of a significant number of filter coefficients. These filter coefficients used by the digital filter may be adapted or optimized to enhance the quality of the processed audio signal. The large number of coefficients, adaptation, and optimization may impose very large memory requirements and a heavy processor load on the signal processing system thereby making the use of FIR filters impractical in some systems. IIR filters may be easier to implement, particularly for equalization filters used in audio applications having high sampling rates (e.g., 44.1 KHz). FIR filters at such high sampling rates may have the aforementioned problems. However, IIR filters may have stability issues because the filter topology employs feedback.

Other filter types include short filters designed in a distorted frequency range, so-called warped FIR or IIR filters. Warped filters, however, also suffer from the need for a long computation time. In an alternative approach, multirate digital systems or filter banks for dividing the audio signal that is to be processed into multiple frequency ranges by parallel band pass filters have been used for equalizing. However, this approach may suffer from high memory requirements and a high latency. Accordingly, there is a need for a signal processing system employing an improved digital filter topology.

SUMMARY

A signal processing system operates on an input signal using time and frequency domain partitioning. A converter is used to convert the digital input signal to provide a first plurality of Fourier transformed signal partitions. A filter signal source is used to provide a plurality of Fourier transformed filter partitions. The partitions of the converter and the filter signal source are provided to a convolution processor that uses the partitions to generate a plurality of convoluted partitioned output signals. The convoluted partitioned output signals may be combined to generate a total spectrum signal that may be inverse Fourier transformed to provide a processed digital output signal.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
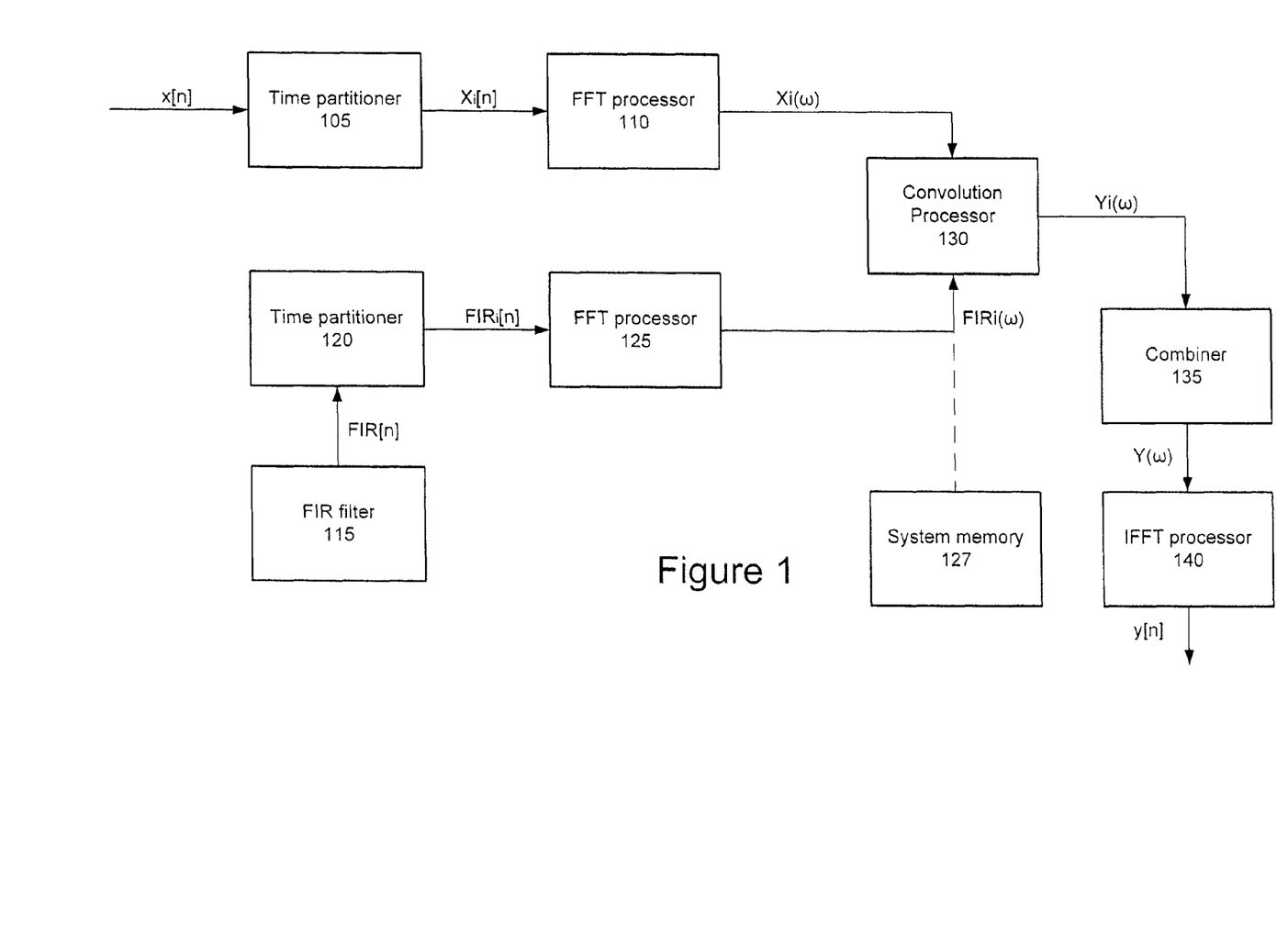
FIG. 1 is a signal processing system that employs time and frequency domain partitioning.

FIG. 1 is a diagram of a signal processing system 100 that employs time and frequency domain partitioning. The signal processing system 100 receives a digital input signal x[n] for processing at the input of a first time partitioner 105. The digital input signal x[n] may correspond to a speech signal that has been subject to an analog-to-digital conversion process. The first time partitioner 105 is adapted to partition the digital input signal x[n] in the time domain into a plurality of time domain partitioned input signals $x_i[n]$, where i is an integer index. The time domain partitioned input signals $x_i[n]$ are subject to a Fourier transform operation by a Fourier transform processor, such as Fast Fourier Transform (FFT) processor 110. The resulting Fourier transform signals are provided as a plurality of Fourier transform signal partitions $X_i(\omega)$ that correspond to the time domain partitioned input signals $X_i[n]$.

The processing system 100 also includes an FIR filter 115 having a filter response FIR(n). The output FIR(n) of the FIR filter 115 is provided to the input of a second time partitioner 120. The second time partitioner is adapted to partition the FIR filter in the time domain into a plurality of time domain partitioned FIR signals $FIR_i[n]$. The signal processing system 100 may use the same number of FIR partitions $FIR_i[n]$ as input signal partitions $x_i[n]$. The plurality of time domain partitioned Fourier signals $FIR_i[n]$ are subject to a Fourier transform operation by a Fourier transform processor, such as FFT processor 125. In practice, the FFT may be carried out using the Cooley-Tukey algorithm, although other FFT algorithms may also be employed. The latency of the transformation process may be determined by the length of the chosen FFT and, for example, may be given by twice the FFT length $N_F$. In order to carry out fast convolutions, the filter partitions $FIR_i[n]$ may be Fast Fourier transformed to obtain the Fourier transformed filter partitions $FIR_i(\omega)$ in the following manner:

$$FIR_i(\omega) = \sum_{n=0}^{N_F-1} x[n]\exp\left(-\frac{2\pi i}{N_F}n\omega\right),$$

The resulting Fourier transform signals are provided as a plurality of Fourier transformed filter partitions $FIR_i(\omega)$ that correspond to the time domain partitioned Fourier signals $FIR_i[n]$. While the plurality of Fourier transformed filter partitions may be generated during operation of the signal processing system 100, the Fourier transformations may be executed off-line and stored in system memory 127 in certain instances where, for example, the response of the FIR filter 115 is fixed.

The plurality of Fourier transformed filter partitions $FIR_i(\omega)$ and the plurality of Fourier transform signal partitions $X_i(\omega)$ are convoluted with one another by a convolution processor 130. In those instances in which the Fourier transform signal partitions are calculated off-line, the values corresponding to the plurality of Fourier transform filter partitions $FIR_i(\omega)$ may be retrieved from the system memory 127 by the convolution processor 130 for processing. The output of the convolution processor 130 is in the form of a plurality of convoluted partitioned output signals $Y_i(\omega)$. The plurality of convoluted partitioned output signals $Y_i(\omega)$ may be provided to the input of a combiner/adder 135 that combines the plurality of convoluted partitioned output signals to generate a total spectrum output signal $Y(\omega)$. The total spectrum output signal $Y(\omega)$ is provided to the input of an Inverse Fast Fourier Transform processor 140 to transform the total spectrum output signal $Y(\omega)$ to a digital output signal y[n]. The digital output signal y[n] corresponds to a filtered/processed version of the digital input signal x[n]. In symbolic notation, the output signal y[n] corresponds to the following equation:

$$y[n] = IFFT(Y(\omega)) \text{ with } Y(\omega) = \sum_i Y_i(\omega) = \sum_i X_i(\omega) \cdot FIR_i(\omega)$$

The digital input signal x[n] may be divided into blocks in the time domain by the time partitioner 105, and the convolution executed by the convolution processor 130 may be performed using an overlap-save block convolution. The blocks may be of equal size for straightforward processing or, alternatively, have different sizes. Shorter blocks may provide a relatively low latency while longer blocks may make the overall convolution operations less expensive in terms of processing power.

The overlap-save block convolution involves the use of a long digital input signal that is broken into successive blocks of $N_x$ samples, each block overlapping the previous block by $N_{FIR}$ samples. Circular convolution of each block is performed. The first $N_{FIR}-1$ values in each output block are discarded, and the remaining values are concatenated to create the output signal. A 50% overlap may be used.

Alternatively, overlap-add convolution may be used. Uniform block sizes offer possibilities for performance optimization if the overlap-add scheme is used in the frequency domain. Overlap-add convolution may be used when the impulse response of the FIR filter 115 is shorter than the block length $N_x$.

The total spectrum signal $Y(\omega)$ may be obtained by using only half of the number of the Fourier components of the Fourier transformed filter partitions $FIR_i(\omega)$. Efficient processing is, thus, enabled.

In the signal processing system 100, the Fourier transformed signal partitions $X_i(\omega)$ and the Fourier transformed filter partitions $FIR_i(\omega)$ are all of the same bandwidth and the mid frequencies are distributed equidistant from one another in the frequency domain. More complicated algorithms for the calculation of the distribution of the mid frequencies are possible and might be applied depending on the actual application.

Figure 2:
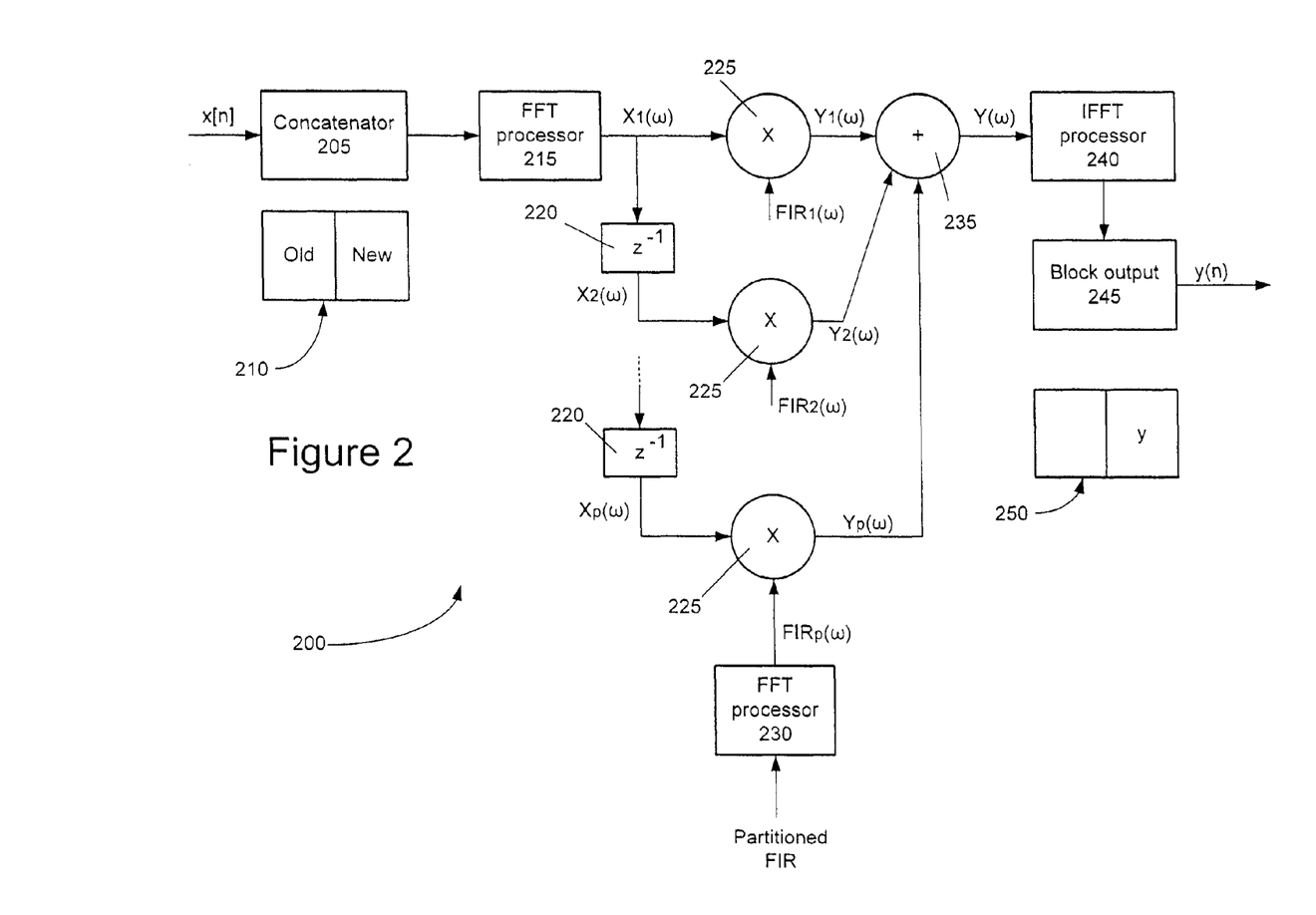
FIG. 2 is a second signal processing system that employs time and frequency domain partitioning.

FIG. 2 is a diagram of another signal processing system 200 that employs time and frequency partitioning. In FIG. 2, the digital input signal x[n] is provided to the input of a concatenator 205. The concatenator 205 sequentially concatenates the input signal x[n] for processing and overlaps old and new digital input information as shown at data block 210. The concatenated data blocks generated by concatenator 205 are provided to the input of an FFT processor 215, which generates corresponding Fourier transformed signal partitions $X_1(\omega)$ through $X_p(\omega)$. The individual the Fourier transformed signal partitions $X_1(\omega)$ through $X_p(\omega)$ correspond to the spectral representation of the respective signal partitions in the time domain and can therefore be delayed in the frequency domain to provide a complete spectral representation of the input signal. Accordingly, each of the Fourier transformed signal partitions $X_1(\omega)$ through $X_p(\omega)$ is delayed by an appropriate amount by delay lines 220 before being applied to the input of a respective convolutor 225. At the respective convolutor 225, each of the Fourier transformed signal partitions $X_1(\omega)$ through $X_p(\omega)$ is convoluted with a respective one of the Fourier transformed FIR partitions $FIR_1(\omega)$ through $FIR_p(\omega)$. Although the Fourier transformed FIR partitions $FIR_1(\omega)$ through $FIR_p(\omega)$ of FIG. 2 are provided at the output of FFT processor 230, the partitioned filter data $FIR_1(\omega)$ through $FIR_p(\omega)$ may be provided from system memory in certain circumstances.

The convolution operations executed by the convolutors 225 result in the generation of a plurality of convoluted partitioned output signals $Y_1(\omega)$ through $Y_p(\omega)$. The plurality of convoluted partitioned output signals $Y_1(\omega)$ through $Y_p(\omega)$ are provided to the input of a combiner/adder 235 to generate a total spectrum signal $Y(\omega)$. The total spectrum signal $Y(\omega)$ is provided to the input of an IFFT processor 240, which provides a block output 245 that includes the data y for the digital output signal y[n]. As shown in the exemplary data block 250, the lower portion of the block output 245 includes the data y for the digital output signal y[n] while the upper portion of the block output may be ignored/discarded.

Figure 3:
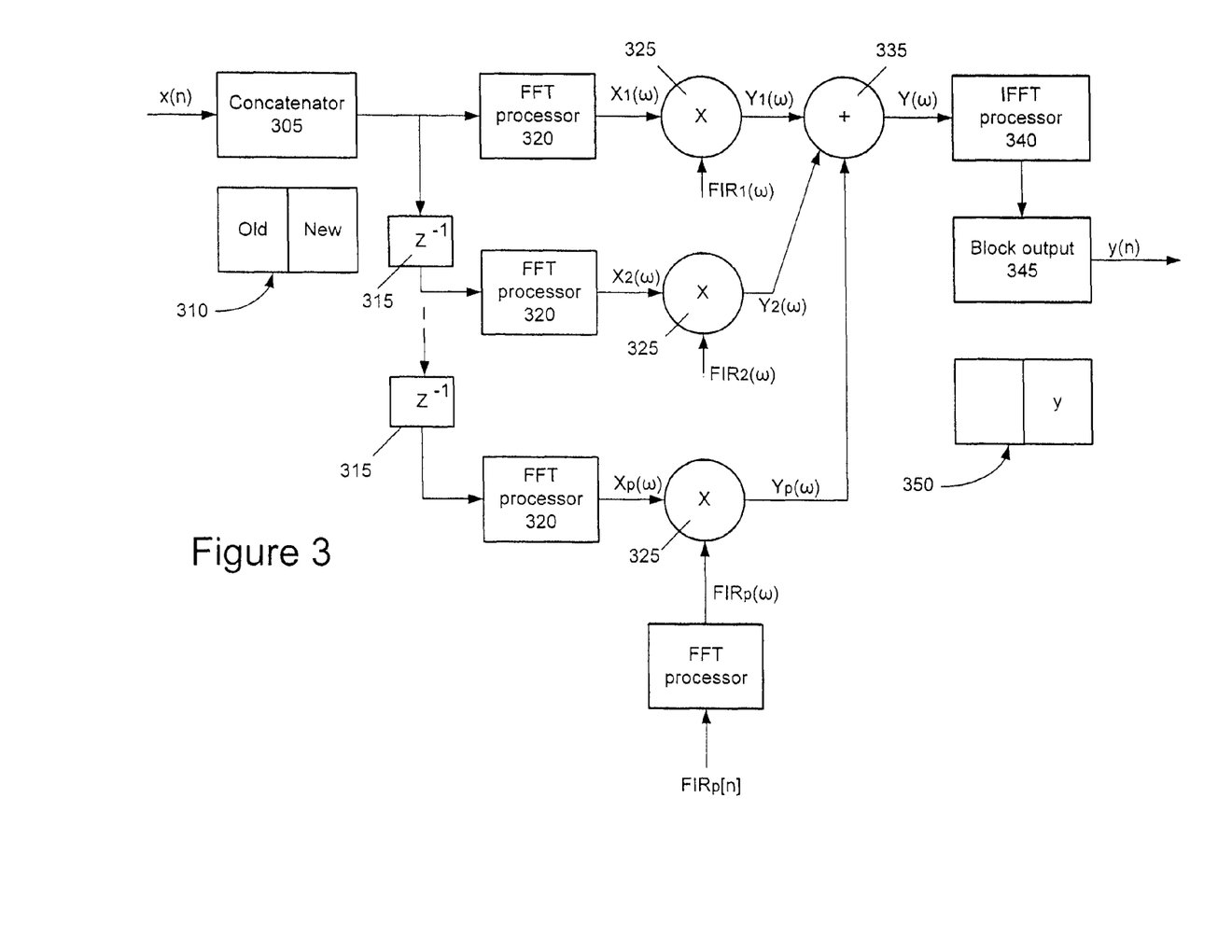
FIG. 3 is a third signal processing system that employs time and frequency domain partitioning.

FIG. 3 is a diagram of another signal processing system 300 that employs time and frequency partitioning. In FIG. 3, the digital input signal x[n] is provided to the input of a concatenator 305. The concatenator 305 sequentially concatenates the input signal x[n] for processing and overlaps old and new digital input information as shown at data block 310. The concatenated data blocks generated by concatenator 305 are delayed by an appropriate amount using delay lines 315 before each delayed signal is provided to the input of a corresponding FFT processor 320. The FFT processors 320 generate a plurality of Fourier transformed signal partitions $X_1(\omega)$ through $X_p(\omega)$ corresponding to the time domain partition input signals provided at the output of the delay lines 315. The Fourier transformed signal partitions $X_1(\omega)$ through $X_p(\omega)$ are provided to the input of respective convolutors 325 where they are each convoluted with a respective one of the Fourier transformed FIR partitions $FIR_1(\omega)$ through $FIR_p(\omega)$. Although the Fourier transformed FIR partitions $FIR_1(\omega)$ through $FIR_p(\omega)$ of FIG. 3 are provided at the output of FFT processor 330, the partition data $FIR_1(\omega)$ through $FIR_p(\omega)$ may likewise be provided from system memory in certain circumstances.

The convolution operations executed by the convolutors 325 result in the generation of a plurality of convoluted partitioned output signals $Y_1(\omega)$ through $Y_p(\omega)$. The plurality of convoluted partitioned output signals $Y_1(\omega)$ through $Y_p(\omega)$ are provided to the input of a combiner/adder 335 to generate a total spectrum signal $Y(\omega)$. The total spectrum signal $Y(\omega)$ is provided to the input of an IFFT processor 340, which provides a block output 345 that includes the data y for the digital output signal y[n]. As shown in the exemplary data block 350 the lower portion of the block output 345 includes the data y for the digital output signal y[n] while the upper portion of the block output may be ignored/discarded.

Figure 4:
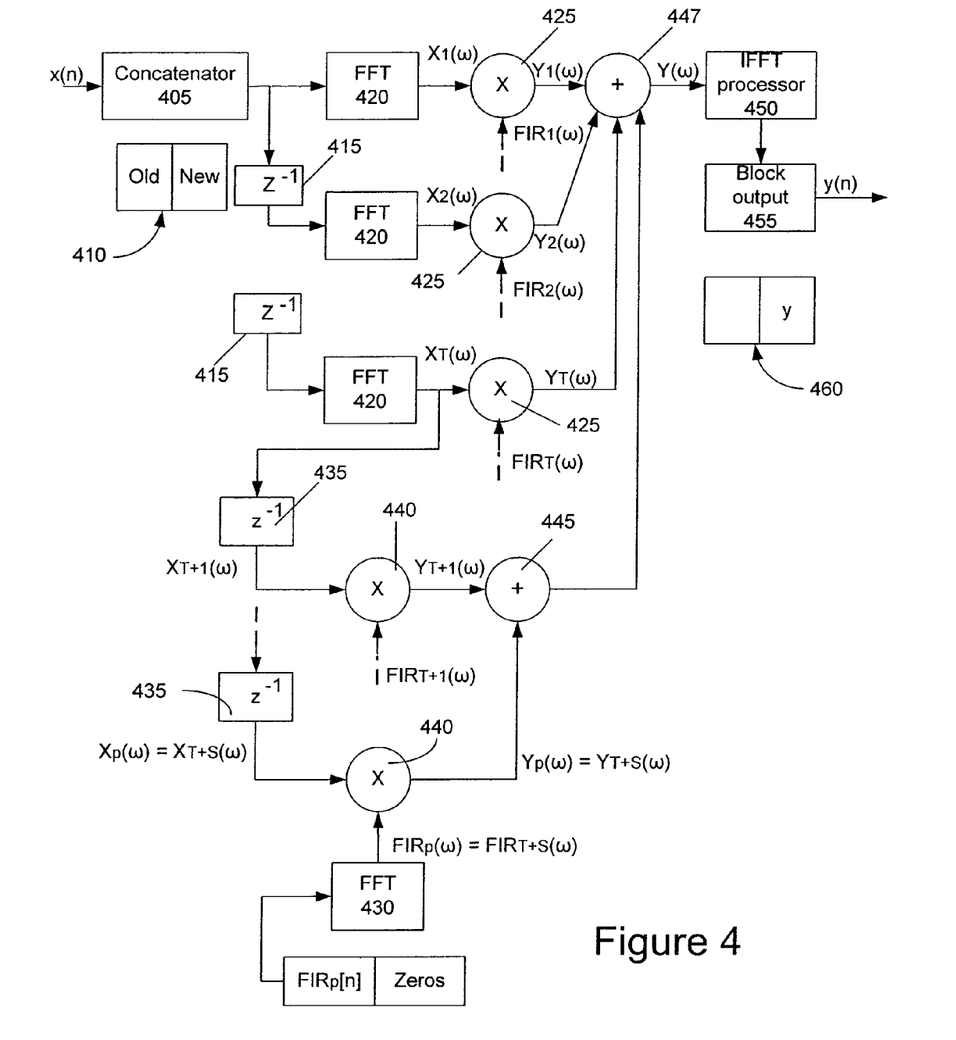
FIG. 4 is a fourth signal processing system that employs time and frequency domain partitioning.

FIG. 4 is a diagram of another signal processing system 400 that employs time and frequency partitioning. In FIG. 4, the digital input signal x[n] is provided to the input of a concatenator 405. The concatenator 405 sequentially concatenates the input signal x[n] for processing and overlaps old and new digital input information as shown at data block 410. The concatenated data blocks generated by concatenator 405 are delayed by an appropriate amount using delay lines 415 before each delayed signal is provided to the input of a corresponding FFT processor 420. The FFT processors 420 generate a plurality of Fourier transformed signal partitions $X_1(\omega)$ through $X_T(\omega)$ corresponding to the time domain partition input signals provided at the output of the delay lines 415. The Fourier transformed signal partitions $X_1(\omega)$ through $X_T(\omega)$ are provided to the input of respective convolutors 425 where they are each convoluted with a respective one of the Fourier transformed FIR partitions $FIR_1(\omega)$ through $FIR_T(\omega)$. Although the Fourier transformed FIR partitions $FIR_1(\omega)$ through $FIR_T(\omega)$ of FIG. 4 are provided at the output of FFT processor 430, the partition data $FIR_1(\omega)$ through $FIR_T(\omega)$ may likewise be provided from system memory in certain circumstances.

The convolution operations executed by the convolutors 425 result in the generation of a plurality of convoluted partitioned output signals $Y_1(\omega)$ through $Y_T(\omega)$. The plurality of convoluted partitioned output signals $Y_1(\omega)$ through $Y_T(\omega)$ are provided to the input of a combiner/adder 435.

As shown in FIG. 4, the output of the Tth FFT processor 420 generates the Fourier transformed input signal $X_T(\omega)$ and is provided to the input of a plurality of sequentially arranged delay lines 435. Each of the delay lines 435 provides its output to a corresponding concatenator 440 that concatenates the delayed output signal with its respective Fourier transformed filter partition. The output of the concatenators 440 $Y_{T+1}(\omega)$ through $Y_{T+S}(\omega)$ are provided to the input of a combiner/adder 445. The output of the combiner/adder 445, in turn, is combined with the other convoluted partitioned output signals $Y_1(\omega)$ through $Y_T(\omega)$ at combiner/adder 447 to generate a total spectrum signal $Y(\omega)$. The total spectrum signal $Y(\omega)$ is provided to the input of an IFFT processor 450, which provides a block output 455 that includes the data y for the digital output signal y[n]. As shown in the exemplary data block 460 the lower portion of the block output 455 includes the data y for the digital output signal y[n] while the upper portion of the block output may be ignored/discarded.

In FIG. 4 a combined partitioning of the digital input signal x[n] in the time and in the spectral domain is illustrated. Different from the example shown in FIG. 3, only part of the digital input signal x[n] is partitioned in the time domain by means of time delay filtering. On the one hand, T partitions $x_1[n], \ldots, x_T[n]$ of the input signal x[n] are each Fast Fourier transformed to obtain T Fourier transformed signal partitions $X_1(\omega), \ldots X_T(\omega)$. On the other hand, S Fourier transformed parts of the input signal are partitioned in the spectral domain to obtain S partitions in the spectral domain $X_{T+1}(\omega), \ldots X_{T+S}(\omega)$. The Fourier transformed signal partitions $X_1(\omega), \ldots, X_{T+S}(\omega)$ are then convoluted with the corresponding Fourier transformed filter partition $FIR_1(\omega), \ldots, FIR_{T+S}(\omega)$, and the results $Y_1(\omega), \ldots, Y_{T+S}(\omega)$ are summed up to obtain the total spectrum $Y(\omega)$.

Figure 5:
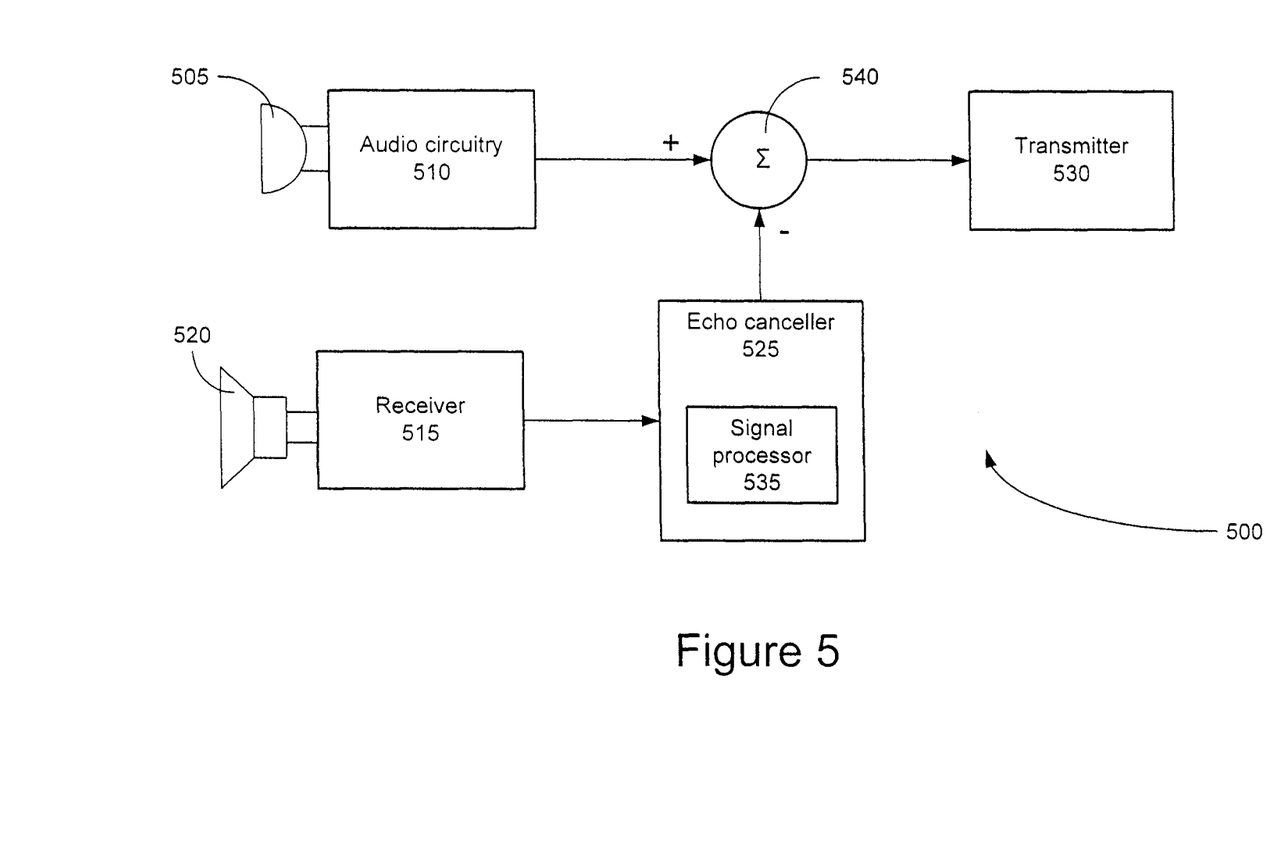
FIG. 5 is a diagram of a hands-free voice communications system that may employ a signal processing system.

FIG. 5 is a diagram of a hands-free voice communication system 500. In FIG. 5, a microphone 505 is connected to corresponding audio circuitry 510 to facilitate voice communication with a remote party. A receiver 515 provides audible communications from the remote party through a loudspeaker 520. An echo canceller 525 is used to inhibit undesired echoes and/or feedback that may otherwise be transmitted through transmitter 530 to the remote party. The echo canceller 525 receives signals from the receiver 515 and/or audio circuitry 510 for processing through, for example, signal processor 535. Signal processor 535 may be configured in the manner shown in FIGS. 1 through 4. The output of the echo canceller 525 is subtracted from the output signal of the audio circuitry 510 at a summing circuit 540 to generate a signal for transmission that is provided to the input of transmitter 530.

Figure 6:
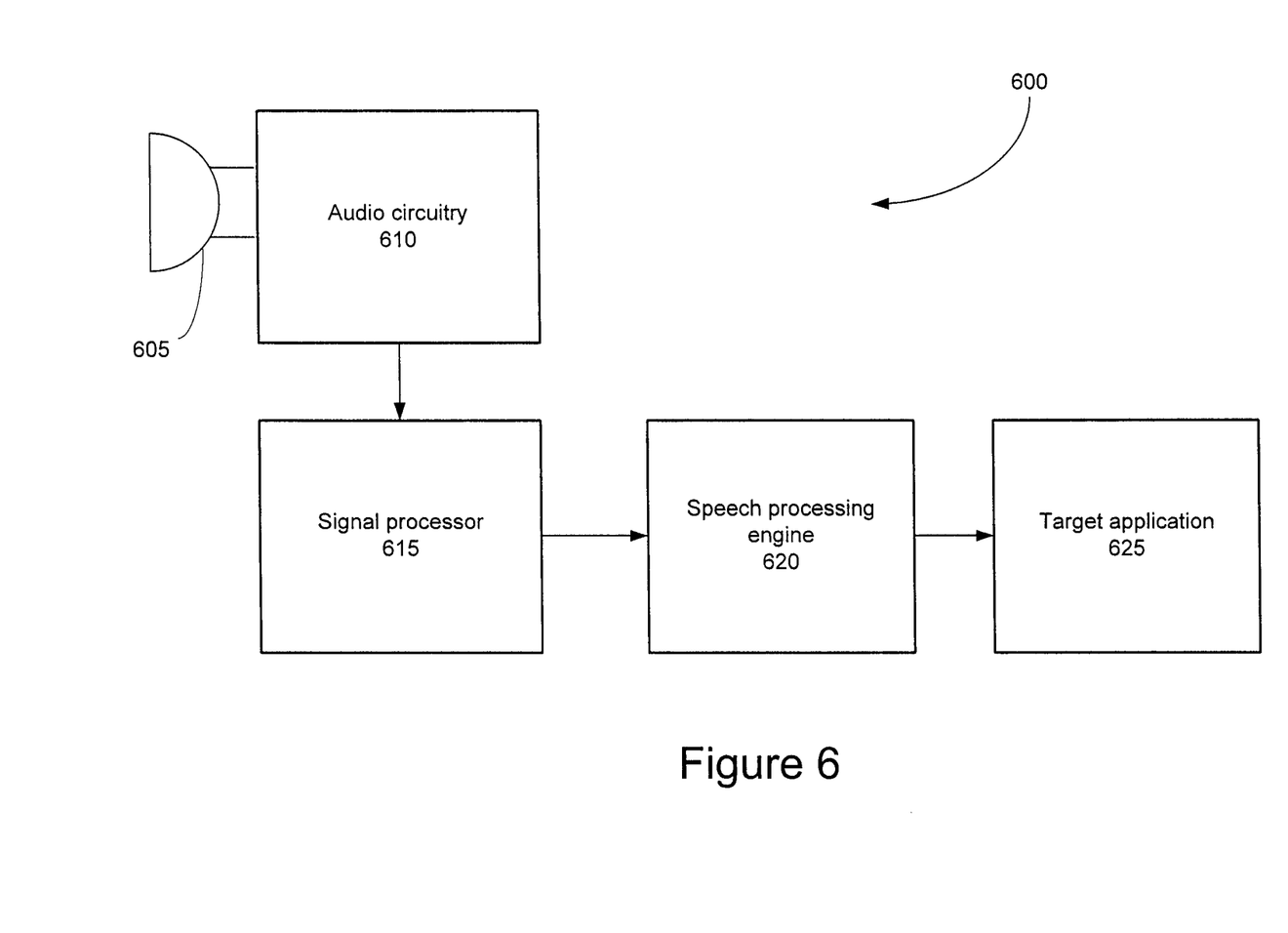
FIG. 6 is a diagram of a speech processing system that may employ a signal processing system.

FIG. 6 is a diagram of a speech processing system 600. The speech processing system may include a microphone 605 that may be used by a user to provide a speech signal to corresponding audio circuitry 610. The output of the audio circuitry 610 is provided to the input of a signal processor 615. Signal processor 615 may be configured in the manner shown in FIGS. 1 through 4. The output of the signal processor 615 may be provided to the input of a speech recognition engine 620 that, in turn, is used to drive a target application 630. The target application may be a speech-to-text application, a voice command application, or other speech controlled application.

Figure 7:
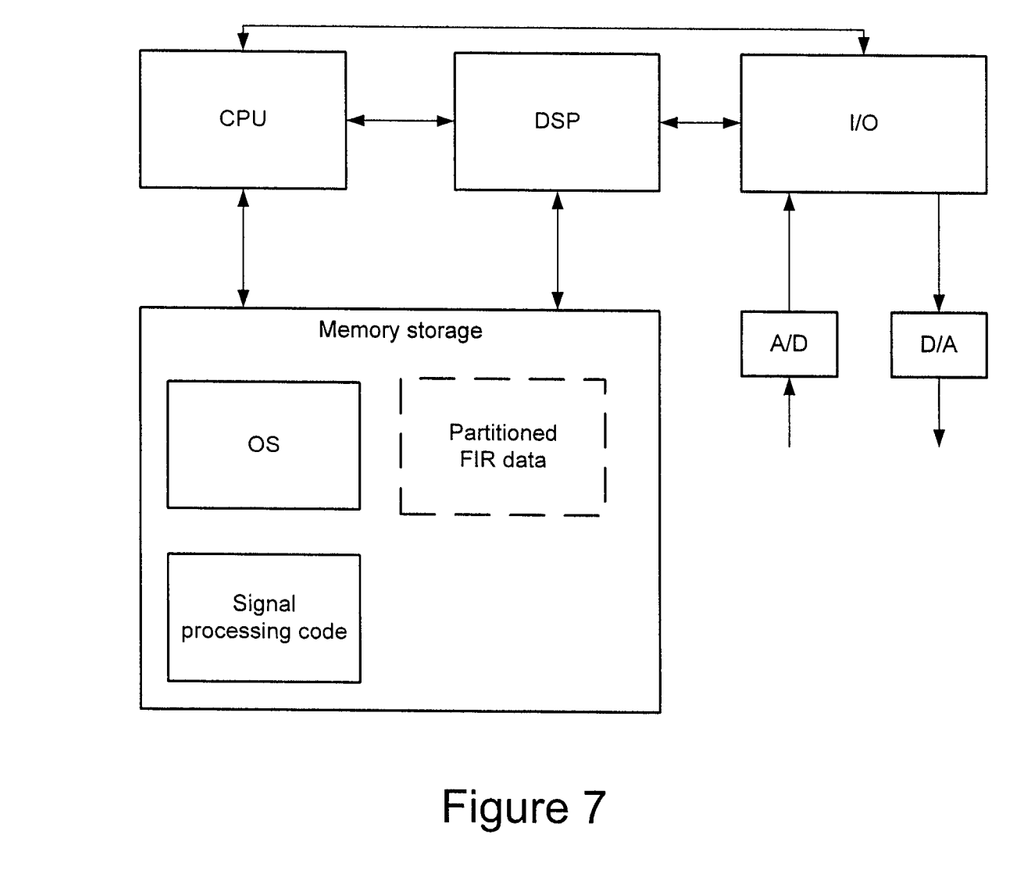
FIG. 7 is a diagram of one platform on which a signal processing system may be implemented.

The systems shown in FIGS. 1 through 4 may be implemented in software, hardware, or a combination of software and hardware. One example of the platform on which the signal processing systems may be implemented is shown in FIG. 7. In FIG. 7, a CPU 705 is in communication with a digital signal processing core 710 memory storage 715 and I/O circuitry 720. Memory storage 715 may include operating system code 725 and signal processing code 730 providing the signal processing instructions used to configure the manner in which the signal processing system is to operate. Memory storage 715 may also include partitioned FIR data 735 comprising Fourier transformed filter partition data that has been calculated off-line. Further, memory storage 715 may be arranged to include networked memory, random access memory, and other memory types to meet system demands.

In FIG. 7, a continuous time domain signal x(t) is provided to the input of an analog-to-digital converter 740 to generate the discrete digital input signals x[n] for processing. Similarly, the processed digital output signals y[n] are provided to the input of a digital-two-analog converter 745 to generate a continuous output signal y(t) in the time domain.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. A signal processing system comprising:
  a converter adapted to convert a digital input signal to provide a plurality of Fourier transformed signal partitions comprising a first and a second plurality of Fourier transformed signal partitions, where the converter comprises:
    an input time partitioner adapted to partition the digital input signal in a time domain into a plurality of time domain partitioned input signals;
    a first plurality of delay lines adapted to receive the plurality of time domain partitioned input signals to generate a plurality of delayed time domain partitioned input signals;
    a plurality of Fourier transform processors respectively associated with each of the first plurality of delay lines to generate the first plurality of Fourier transformed signal partitions corresponding to the time domain partitioned input signal of the input time partitioner; and
    a second plurality of delay lines connected to one of the plurality of Fourier transform processors and adapted to generate the second plurality of Fourier transformed signal partitions;
  a filter signal source adapted to provide a plurality of Fourier transformed filter partitions, the filter signal source comprising:
    a filter time partitioner adapted to partition an FIR filter in the time domain into a plurality of time domain partitioned filter signals; and
    a filter Fourier transform processor adapted to provide the plurality of Fourier transformed filter partitions corresponding to the time domain partitioned filter signals of the filter time partitioner; and
  a convolution processor adapted to provide a plurality of convoluted partitioned output signals corresponding to a convolution of the partitions provided by the converter and the filter signal source.

2. The signal processing system of claim 1, where the filter signal source calculates Fourier transformed signal partitions in an off-line process, and wherein off-line processed Fourier transformed filter partition data is stored in system memory.

3. A signal processing system comprising:
  a first time partitioner adapted to partition a digital input signal in a time domain into a plurality of time domain partitioned input signals;
  a first plurality of delay lines adapted to receive the plurality of time domain partitioned input signals to generate a plurality of delayed time domain partitioned input signals;
  a plurality of Fourier transform processors respectively associated with each of the first plurality of delay lines to generate a first plurality of Fourier transformed signal partitions corresponding to the time domain partitioned input signal provided by the first time partitioner;
  a second plurality of delay lines connected to one of the plurality of Fourier transform processors and adapted to generate a second plurality of Fourier transformed signal partitions;
  a second time partitioner adapted to partition a finite impulse response (FIR) filter in the time domain into a plurality of time domain partitioned FIR signals;
  a Fourier transform processor adapted to provide a plurality of Fourier transformed filter partitions corresponding to the plurality of time domain partitioned FIR signals;
  a convolution processor adapted to provide a plurality of convoluted partitioned output signals corresponding to a convolution of the partitions provided by the plurality of Fourier transform processors and the second plurality of delay lines and the Fourier transform processor; and
  where the first time partitioner divides the input signal into blocks in the time domain and the convolution processor executes an overlap-save block convolution of the partitions provided by the plurality of Fourier transform processors and the second plurality of delay lines and second Fourier transform processors.

4. The signal processing system of claim 3, and further comprising a combiner adapted to combine the plurality of convoluted partitioned output signals to obtain an output signal corresponding to a total spectrum output signal.

5. The signal processing system of claim 4, and further comprising an inverse Fourier transform processor adapted to perform an inverse Fourier transform operation on the total spectrum output signal to obtain a digital output signal.

6. The signal processing system of claim 3, where the first time partitioner divides the input signal into blocks in the time domain.

7. The signal processing system of claim 3, where the Fourier transformed signal partitions and the Fourier transformed filter partitions of the Fourier transform processor have a same bandwidth.

8. The signal processing system of claim 7, where the Fourier transformed signal partitions and the plurality of Fourier transformed filter partitions of the Fourier transform processor have frequency responses in which the mid frequencies are equally distributed with respect to one another in a frequency domain.

9. The signal processing system of claim 3, where
the first time partitioner is adapted to partition a first portion of an input signal x[n] to obtain T partitions $x_T[n]$ and a second portion of the input signal x[n] to obtain S partitions $x_S[n]$, where S and T are both integers;
the plurality of Fourier transform processors are adapted to transform input signal partitions $x_T[n]$ to obtain T Fourier transformed signal partitions $X_T(\omega)$ as the first plurality of Fourier transformed signal partitions and to transform input signal partitions $x_S[n]$ to obtain S Fourier transformed signal partitions $X_S(\omega)$ as the second plurality of Fourier transformed signal partitions;
the second time partitioner is adapted to provide T time domain partitioned FIR signals $FIR_T[n]$ corresponding to a first portion of the FIR filter and S time domain partitioned FIR signals $FIR_S[n]$ corresponding to a second portion of the FIR filter; and
the Fourier transform processor is adapted to transform the T time domain partitioned FIR signals $FIR_T[n]$ to obtain corresponding Fourier transformed filter partitions $FIR_T(\omega)$ and to transform the S time domain partitioned FIR signals $FIR_T[n]$ to obtain corresponding Fourier transformed filter partitions $FIR_S(\omega)$.

10. The signal processing system of claim 9, where the convolution processor executed a convolution process on the Fourier transformed signal partitions ($X_T(\omega)$ and $X_S(\omega)$) and the corresponding Fourier transformed filter partitions ($FIR_T(\omega)$ and $FIR_S(\omega)$) to provide a plurality of convoluted partitioned output signals $Y_1(\omega), \ldots, Y_{T+S}(\omega)$.

11. The signal processing system of claim 10, and further comprising a combiner adapted to combine the plurality of convoluted partitioned output signals $Y_1(\omega), \ldots, Y_{T+S}(\omega)$ to obtain an output signal corresponding to a total spectrum output signal.

12. A signal processing system comprising:
a first time partitioning means for partitioning a digital input signal in a time domain into a plurality of time domain partitioned input signals;
a first plurality of delay lines adapted to receive the plurality of time domain partitioned input signals to generate a plurality of delayed time domain partitioned input signals;
a first plurality of Fourier transform means respectively associated with each of the first plurality of delay lines for transforming the plurality of time partitioned input signals into a first plurality of Fourier transformed signal partitions;
a second plurality of delay lines connected to one of the plurality of Fourier transform means and adapted to generate a second plurality of Fourier transformed signal partitions;
a second time partitioning means for partitioning a finite impulse response (FIR) filter in the time domain into a plurality of time domain partitioned FIR signals;
a second Fourier transform means for transforming the plurality of time domain partitioned FIR signals into a plurality of Fourier transformed filter partitions; and
convolution means for convoluting the first and second pluralities of Fourier transformed signal partitions and the plurality of Fourier transformed filter partitions to provide a plurality of convoluted partitioned output signals; where
the first time partitioning means partitions a first portion of an input signal x[n] to obtain T partitions $x_T[n]$ and a second portion of the input signal x[n] to obtain S partitions $x_S[n]$, where S and T are both integers;
the first plurality of Fourier transform means transforms the input signal partitions $x_T[n]$ to obtain T Fourier transformed signal partitions $X_T(\omega)$ as the first plurality of Fourier transformed signal partitions and transforms input signal partitions $x_S[n]$ to obtain S Fourier transformed signal partitions $X_S(\omega)$ as the second plurality of Fourier transformed signal partitions;
the second time partitioning means partitions a first portion of a FIR filter into T time domain partitioned FIR signals FIRT[n] and partitions a second portion of the FIR filter into S time domain partitioned FIR signals FIRS[n]; and
the second Fourier transform means transforms the T time domain partitioned FIR signals FIRT[n] to obtain corresponding Fourier transformed filter partitions FIRT($\omega$) and transforms the S time domain partitioned FIR signals FIRT[n] to obtain corresponding Fourier transformed filter partitions FIRS($\omega$).

13. The signal processing system of claim 12, and further comprising combiner means for combining the plurality of convoluted partitioned output signals to obtain an output signal corresponding to a total spectrum output signal.

14. The signal processing system of claim 13, and further comprising an inverse Fourier transform means for executing an inverse Fourier transform operation on the total spectrum output signal to obtain a digital output signal.

15. The signal processing system of claim 12, where the first time partitioning means divides the input signal into blocks in the time domain, and where the convolution means executes an overlap-save block convolution of the partitions provided by the first plurality of Fourier transform means and the second plurality of delay lines and the second Fourier transform means.

16. The signal processing system of claim 12, where the Fourier transformed signal partitions and the Fourier transformed filter partitions of the second Fourier transform means have a same bandwidth.

17. The signal processing system of claim 16, where the Fourier transformed signal partitions and the Fourier transformed filter partitions have frequency responses in which the mid frequencies are equally distributed with respect to one another in a frequency domain.

18. The signal processing system of claim 12, where the convolution means convolutes the Fourier transform signal partitions ($X_T(\omega)$ and $X_S(\omega)$) with the corresponding Fourier transformed filter partitions ($FIR_T(\omega)$ and $FIR_S(\omega)$) to provide a plurality of convoluted partitioned output signals $Y_1(\omega), \ldots, Y_{T+S}(\omega)$.

19. The signal processing system of claim 18, and further comprising combiner means for combining the plurality of convoluted partitioned output signals $Y_1(\omega), \ldots, Y_{T+S}(\omega)$ to obtain an output signal corresponding to a total spectrum output signal.

20. A computerized method for processing a signal comprising:
partitioning a digital input signal in a time domain into a plurality of time domain partitioned input signals;
delaying the plurality of time domain partitioned input signals to generate a plurality of delayed time domain partitioned input signals;

Fourier transforming, with at least one processor, the plurality of time domain partitioned input signals into a plurality of Fourier transformed signal partitions, wherein a first portion of the time domain partitioned input signals is Fourier transformed during a same cycle to generate a first plurality of Fourier transformed signal partitions;

applying consecutive delays to a second portion of the plurality of Fourier transformed signal partitions to generate a second plurality of Fourier transformed signal partitions;

time partitioning a finite impulse response (FIR) filter in the time domain into a plurality of time domain partitioned FIR signals;

Fourier transforming, with the at least one processor, the plurality of time domain partitioned FIR signals into a plurality of Fourier transformed filter signal partitions, where the plurality of Fourier transformed signal partitions and the plurality of Fourier transformed filter signal partitions have a same bandwidth; and convoluting the plurality of Fourier transformed signal partitions and the plurality of Fourier transformed filter signal partitions with one another to provide a plurality of convoluted partitioned output signals.

21. The method of claim 20, and further comprising combining the plurality of convoluted partitioned output signals to obtain an output signal corresponding to a total spectrum output signal.

22. The method of claim 21, and further comprising executing an inverse Fourier transform operation on the total spectrum output signal to obtain a digital output signal.

23. The method of claim 20, where partitioning of the digital input in the time domain signal divides the digital input signal into blocks in the time domain, and where convolution of the plurality of Fourier transformed signal partitions with the plurality of Fourier transformed filter signal partitions comprises execution of an overlap-save block convolution.

24. The method of claim 20, where the plurality of Fourier transformed signal partitions and the plurality of Fourier transformed filter signal partitions have frequency responses in which the mid frequencies are equally distributed with respect to one another in a frequency domain.

25. The method of claim 20, where the partitioning of the digital input signal includes partitioning the first portion of a digital input signal x[n] to obtain T partitions $x_T[n]$ and the second portion of the digital input signal x[n] to obtain S partitions $x_S[n]$, where S and T are both integers;

the Fourier transforming of the plurality of time domain partitioned input signals includes Fourier transforming partitions $x_T[n]$ to obtain T Fourier transformed signal partitions $X_T(\omega)$ and transforming partitions $x_S[n]$ to obtain S Fourier transformed signal partitions $X_S(\omega)$;

the time partitioning of the FIR filter includes partitioning a first portion of the FIR filter into T time domain partitioned FIR signals $FIR_T[n]$ and partitioning a second portion of the FIR filter into S time domain partitioned FIR signals $FIR_S[n]$; and the Fourier transforming of the plurality of time partitioned FIR signals includes transforming the T time domain partitioned FIR signals $FIR_T[n]$ to obtain corresponding Fourier transformed filter partitions $FIR_T(\omega)$ and transforming the S time domain partitioned FIR signals $FIR_T[n]$ to obtain corresponding Fourier transformed filter partitions $FIR_S(\omega)$.

26. The method of claim 25, where the convoluting comprises convoluting the Fourier transform signal partitions ($X_T(\omega)$ and $X_S(\omega)$) with the corresponding Fourier transformed filter partitions ($FIR_T(\omega)$ and $FIR_S(\omega)$) to provide a plurality of convoluted partitioned output signals $Y_1(\omega), \ldots, Y_{T+S}(\omega)$.

27. The method of claim 26, and further comprising combining the plurality of convoluted partitioned output signals $Y_1(\omega), \ldots, Y_{T+S}(\omega)$ to obtain an output signal corresponding to a total spectrum output signal.

28. A non-transitory computer readable storage medium having stored therein data representing instructions that are executable by a processor for processing a signal, the computer readable storage medium comprising instructions operative for:

partitioning a digital input signal in a time domain into a plurality of time domain partitioned input signals;

delaying the plurality of time domain partitioned input signals to generate a plurality of delayed time domain partitioned input signals;

Fourier transforming the plurality of time domain partitioned input signals into a plurality of Fourier transformed signal partitions, wherein a first portion of the time domain partitioned input signals is Fourier transformed during a same cycle to generate a first plurality of Fourier transformed signal partitions;

applying consecutive delays to a second portion of the plurality of Fourier transformed signal partitions to generate a second plurality of Fourier transformed signal partitions;

time partitioning a finite impulse response (FIR) filter in the time domain into a plurality of time domain partitioned FIR signals;

Fourier transforming the plurality of time domain partitioned FIR signals into a plurality of Fourier transformed filter partitions; and convoluting the plurality of Fourier transformed signal partitions with the plurality of Fourier transformed filter partitions to provide a plurality of convoluted partitioned output signals; where:

the partitioning of the digital input signal in the time domain includes partitioning the first portion of a digital input signal x[n] to obtain T partitions $x_T[n]$ and the second portion of the digital input signal x[n] to obtain S partitions $x_S[n]$, where S and T are both integers;

the Fourier transforming of the plurality of time domain partitioned input signals includes Fourier transforming partitions $x_T[n]$ to obtain T Fourier transformed signal partitions $X_T(\omega)$ and transforming a input signal partitions $x_S[n]$ to obtain S Fourier transformed signal partitions $X_S(\omega)$;

the time partitioning of a FIR filter includes partitioning a first portion of the FIR filter into T time domain partitioned FIR signals FIRT[n] and partitioning a second portion of the FIR filter into S time domain partitioned FIR signals FIRS[n]; and the Fourier transforming of the plurality of time domain partitioned FIR signals includes transforming the T time domain partitioned FIR signals FIRT[n] to obtain corresponding Fourier transformed filter partitions FIRT($\omega$) and transforming the S time domain partitioned FIR signals FIRT[n] to obtain corresponding Fourier transformed filter partitions FIRS($\omega$).

29. The non-transitory storage medium of claim 28, the instructions further operative for combining the plurality of convoluted partitioned output signals to obtain an output signal corresponding to a total spectrum output signal.

30. The non-transitory storage medium of claim 29, the instructions further operative for executing an inverse Fourier transform operation on the total spectrum output signal to obtain a digital output signal.

31. The non-transitory storage medium of claim 28, where the convoluting comprises convoluting the Fourier transformed signal partitions ($X_T(\omega)$ and $X_S(\omega)$) with the corresponding Fourier transformed filter partitions ($FIR_T(\omega)$ and $FIR_S(\omega)$) to provide a plurality of convoluted partitioned output signals $Y_1(\omega), \ldots, Y_{T+S}(\omega)$.

32. The non-transitory storage medium of claim 31, the instructions further operative for combining the plurality of convoluted partitioned output signals $Y_1(\omega), \ldots, Y_{T+S}(\omega)$ to obtain an output signal corresponding to a total spectrum output signal.

33. A signal processing system comprising:
a time partitioner adapted to partition a digital input signal in a time domain into a plurality of time domain partitioned input signals;
a first plurality of delay lines adapted to receive the plurality of time domain partitioned input signals to generate a plurality of delayed time domain partitioned input signals;
a plurality of Fourier transform processors respectively associated with each of the first plurality of delay lines to generate a first plurality of Fourier transformed signal partitions corresponding to the time domain partitioned input signal provided by a first time partitioner, during a same cycle;
a second plurality of delay lines connected to one of the plurality of Fourier transform processors and adapted to generate a second plurality of Fourier transformed signal partitions;
memory storage comprising a plurality of Fourier transformed filter partitions corresponding to a plurality of time domain partitioned FIR signals of an FIR filter;
a convolution processor adapted to provide a plurality of convoluted partitioned output signals corresponding to a convolution of the first and second pluralities of Fourier transformed signal partitions and the plurality of Fourier transformed filter partitions, where the convolution processor executes an overlap-save block convolution of the first and second pluralities of Fourier transformed signal partitions and the plurality of Fourier transformed filter partitions;
a combiner adapted to combine the plurality of convoluted partitioned output signals to obtain an output signal corresponding to a total spectrum output signal; and
an inverse Fourier transform processor adapted to perform an inverse Fourier transform operation on the total spectrum output signal to obtain a digital output signal.

34. The signal processing system of claim 33, where the first time partitioner divides the digital input signal into blocks in the time domain.

* * * * *